United States Patent [19]

Tokuda

[11] 3,980,901
[45] Sept. 14, 1976

[54] TRIGGER PULSE GENERATOR CIRCUIT
[75] Inventor: Kazuo Tokuda, Tokyo, Japan
[73] Assignee: Nippon Electric Company, Ltd., Tokyo, Japan
[22] Filed: Jan. 31, 1975
[21] Appl. No.: 546,174

[30] Foreign Application Priority Data
Feb. 1, 1974   Japan.............................. 49-13983

[52] U.S. Cl.............................. 307/300; 307/254; 307/268
[51] Int. Cl.² ........................................ H03K 17/00
[58] Field of Search................ 307/300, 254, 255 X, 307/229 X, 268 X

[56]            References Cited
           UNITED STATES PATENTS
3,299,290   1/1967   Moll................................... 307/300
3,530,313   9/1970   Gassmann........................... 307/300
3,588,544   6/1971   Wallingford........................ 307/300
3,798,471   3/1974   Williams et al...................... 307/255

Primary Examiner—Stanley D. Miller, Jr.
Assistant Examiner—B. P. Davis
Attorney, Agent, or Firm—Sughrue, Rothwell, Mion, Zinn and Macpeak

[57]        ABSTRACT

A trigger pulse generator circuit for converting an input pulse into a sharp pulse to be used as a trigger pulse is disclosed. The input pulse is applied to a first and a second switching means which are connected in cascade, the second switching means having a larger delay time than that of the first switching means. An output trigger pulse is derived from a connecting point of the first and second switching means. The first switching means becomes cut-off in response to the removal of the input pulse, while the second switching means becomes cut-off a predetermined time after the removal of the input pulse due to a time delay caused by the storage time of a transistor of the second switching means. In consequence, a sharp trigger pulse is derived from the output terminal. Preferably, a discharging means for the charge stored in the second switching means is further provided between the ground and the second switching means. This trigger pulse generator circuit is advantageous in that no capacitive element is necessitated, and so it is quite suitable for application to an integrated circuit.

13 Claims, 3 Drawing Figures

3,980,901

TRIGGER PULSE GENERATOR CIRCUIT

FIELD OF THE INVENTION

The present invention relates to a circuit for generating driving pulses for a pulse circuit, and more particularly to a trigger pulse generator circuit for generating trigger pulses.

BACKGROUND OF THE INVENTION

Trigger pulses are generally used for synchronizing a multi-vibrator and also for driving other pulses circuits.

Heretofore, the most conventional circuit for obtaining a pulse having a pulse width suitable for synchronization and/or driving has been a differentiating circuit composed of a capacitor and a resistor. In order to integrate circuits including such a differentiating circuit, it is necessary to provide terminals for externally mounting a capacitor. The alternative circuit suitable for a digital IC has been proposed for such purposes. In such a trigger pulse generator circuit, an output pulse obtained as a result of delaying an input pulse through an integrated circuit and the original input pulse are applied respectively to two inputs of an AND-circuit to derive at its output a trigger pulse having a pulse width corresponding to the overlapping time intervals of the two input signals. However, even in this case, a capacitor and its external mounting terminals are necessitated.

As described above, the trigger pulse generator circuits in the prior art were associated with various disadvantages due to the use of a capacitor, and so they were not suitable for circuit integration, in particular for semiconductor IC, and also were not simple in handling.

SUMMARY OF THE INVENTION

Therefore, it is a principal object of the present invention to provide a trigger pulse generator circuit without making use of a capacitor, and thereby to resolve the aforementioned various problems.

In order to achieve the above object, the inventor has constructed a trigger pulse generator circuit by making use of the charge storage effect of a transistor.

In the trigger pulse generator circuit according to the present invention, an input pulse is applied to a first and a second switching means which are connected to cascade, the second switching means having a larger delay time than that of the first switching means. As a result, an output trigger pulse is derived from a connecting point of the first and second switching means owing to the difference between the delay times of the first and second switching means. The second switching means in preferred and practicable embodiments, includes a switching element connected to the first switching means in cascade and a control element for controlling the operation of the switching element. During the rise time of the input pulse and also during the periods of time when the input pulse is present or absent, the output terminal is held at a low potential. During the fall time of the input pulse, the second switching means changes into the cut-off state a predetermined time after the change of the first switching means into the cut-off state, the predetermined time being equal to the storage time of a transistor of the second switching means. In consequence, a sharp trigger pulse is derived from the output terminal.

A discharging means for the charge stored in the second switching means is preferably added between the ground and the second switching means in order to warrant a reliable operation regardless of the value of a load impedance.

The above-featured trigger pulse generator circuit requires neither a differentiating circuit nor an integrating circuit nor a capacitor. Therefore, the trigger pulse generator circuit according to the present invention is suitable for circuit integration, and easy in handling, and in addition it can provide various other inherent advantages.

DETAILED DESCRIPTION OF PREFERRED EMBODIMENTS

Figure 1:
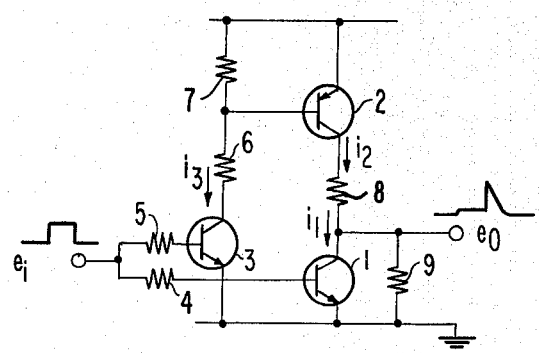
FIG. 1 is a schematic circuit diagram showing a first embodiment of the trigger pulse generator circuit according to the present invention.

Now the present invention will be described in more detail in connection with its preferred embodiments illustrated in the accompanying drawings. Referring first to FIG. 1, a first embodiment of the trigger pulse generator circuit according to the present invention is schematically shown. In this figure, the emitter electrodes of NPN transistors 1 and 3 are connected in common to the ground, and their respective base electrodes are connected to a common signal input terminal through a resistor 4 and a resistor 5, respectively. The collector electrode of the transistor 3 is connected through a series connection of resistors 6 and 7 to an ungrounded terminal of a power supply (not shown). The junction point between the resistors 6 and 7 is connected to the base electrode of a PNP transistor 2 whose emitter electrode is connected to the ungrounded terminal of the power supply. The collector electrode of the transistor 1 is connected through a resistor 8 to the collector electrode of the transistor 2. The collector electrode of the transistor 1 is also grounded through a resistor 9 sufficiently larger than the resistor 8 but low enough to discharge the charge stored in the transistor 2 quickly thus resulting in a pulse of smaller width than the input pulse. The respective resistance values are selected in such a manner that when the aforementioned circuit has been actuated in response to a predetermined input signal, the respective transistors may operate in their saturated ranges upon conducting.

Figure 2:
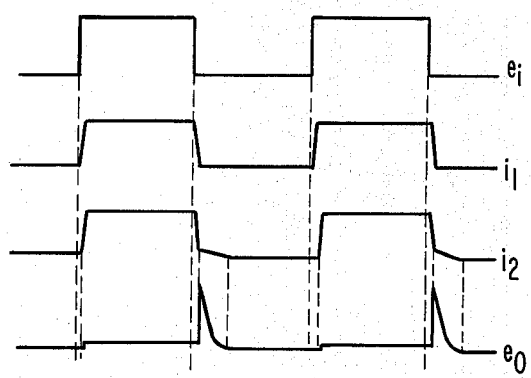
FIG. 2 is a waveform diagram showing voltage and current waveforms at various points in the trigger pulse generator circuit of FIG. 1 for explaining the operation of the circuit.

It is to be noted that, when a load element (not shown) connected to the output terminal has an impedance equal to the above-mentioned value required for in the resistor 9, the resistor 9 may be eliminated. In other words, due to the resistor 9, the sharp trigger pulse can be derived from the circuit regardless of the load impedance. FIG. 2 is a waveform diagram for assisting the explanation of the operation of the circuit having the above-described construction, in which a voltage waveform of an input signal applied to the input terminal is represented at $e_i$, current waveforms of the currents flowing through the transistors 1 and 2 are represented at $i_1$ and $i_2$, respectively, and an output voltage waveform is represented at $e_o$. If the input signal $e_i$ is applied to the input terminal, the collector current of the transistor 3 increases to its saturations level after a predetermined period of time, that is, after a period equal to the sum of a delay time $t_d$ and a rise time $t_r$ of the input pulse. Since the base potential of the transistor 2 is determined by the collector current of the transistor 3, the collector current $i_2$ of the transistor 2 increases to its saturation level after a further delay of a predetermined time. Though the base potential of the transistor 1 is placed under the same condition as the base potential of the transistor 3, the collector current of the transistor 1 cannot flow unless and until the transistor 2 becomes conducting. When the collector current of the transistor 1 reaches its saturation level, it short-circuits across the resistor 9, although a small voltage would appear across the resistor 9 due to a voltage drop across the collector-emitter path of the transistor 1 upon saturation.

When the input signal voltage $e_i$ becomes zero, that is, at the trailing edge of the input signal waveform, the base potentials of the transistors 1 and 3, respectively, become zero, while the collector currents $i_1$ and $i_3$ of the transistors 1 and 3, respectively, would become zero after a delay of a predetermined time, equal to the sum of a storage time $t_s$ and a falling time $t_f$ of the input pulse. Since the base potential of the transistor 2 is determined by the collector current $i_3$ of the transistor 3, the collector current $i_2$ of the transistor 2 tends to become zero after a further delay of a predetermined time. However, since the transistor 1 has been already switched to its cut-off state at that time, the collector current, that is, the current caused by the charge storage effect of the transistor 2 flows through the resistor 9. Accordingly, a sharp pulse voltage having a peak value substantially equal to the power supply voltage would appear across the resistor 9, because the resistance value of the resistor 9 is selected sufficiently larger than that of the resistor 8 as described previously. Since the storage time of the transistor 2 is determined by the resistor 9, the pulse width of the trigger pulse is varied in accordance with the resistance value of the resistor 9, with the width increasing the resistance value in increased and vice versa.

Figure 3:
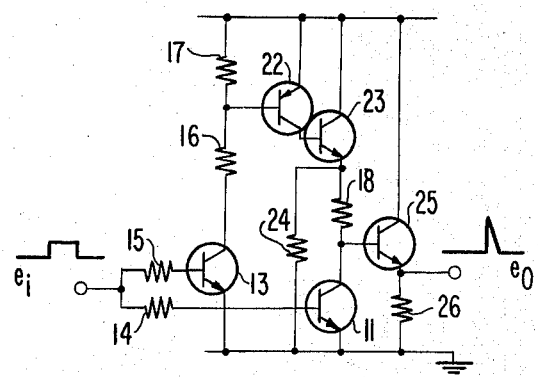
FIG. 3 is a schematic circuit diagram showing a second embodiment of the trigger pulse generator circuit according to the present invention.

A second embodiment of the pulse generator circuit according to the present invention, which has been constructed by partly modifying the pulse generator circuit of FIG. 1, is illustrated in FIG. 3. In more particular, the part corresponding to the transistor 2 in FIG. 1 is replaced by a Darlington connection of transistors 22 and 23, which is deemed to be equivalent to one transistor having a large current amplification factor. If the circuit is constructed in the above-described modified form, then the storage time $t_s$ can be further prolonged, and it becomes possible to obtain a trigger pulse having a pulse width larger than that in the case of the first embodiment. A transistor 11 achieves the same function as the above-described transistor 1, and a transistor 13 achieves the same function as the above-described transistor 3. In addition, a circuit element equivalent to that shown in FIG. 1 is designated by a reference numeral formed by adding 10 to the corresponding reference numeral in FIG. 1. A transistor 25 is a transistor used for impedance matching, and the output pulse is derived from an emitter load 26 for the transistor 25. In this modified circuit also, the pulse width of the output pulse can be varied by changing the resistance value of a resistor 24 connected between the emitter of the transistor 23 and the ground.

As will be appreciated from the above-described embodiments, the circuit according to the present invention requires no capacitor, and also has various advantages such that adjustment and/or presetting of the pulse width of an output sharp trigger pulse are possible.

While transistors of specific conduction types have been used in the illustrated embodiments, it is possible to replace these transistors by transistors of opposite conduction types, and also it is possible to replace the transistors by other switching elements. Therefore, the scope of the invention should not be limited to the embodiments as described above and illustrated in the accompanying drawings, but it should be defined only by the appended claims.

What we claim is:
1. A trigger pulse generator circuit comprising:
an input terminal;
a ground potential terminal;
a power supplying terminal;
a first transistor of a first conduction type having its emitter and base electrically coupled with said ground potential terminal and said input terminal, respectively, and having its collector connected to said power supplying terminal through a first and a second resistors;
a second transistor of said conduction type having its emitter and base electrically coupled with said ground potential terminal and said input terminal, respectively, and having a collector, the electrical state between said emitter and said collector of said second transistor becoming conductive in response to an input pulse supplied to said input terminal and assuming a first state and non-conductive in response to said input pulse assuming a second state;
a third transistor of a second conduction type having its emitter connected to said power supplying terminal, its base to the junction point of said first and second resistors, and its collector to said collector of said second transistor through a third resistor, the electrical state between said emitter and said collector of said third transistor becoming conductive in response to said input pulse assuming said first state and non-conductive in response to said input pulse assuming said second state but after a predetermined time from the time when said electrical state between said emitter and said collector of said second transistor becomes non-conductive;
a fourth resistor connected between said ground potential and said collector of said second transistor, siad fourth resistor releasing a charge stored in said third transistor during said predetermined time when said electrical state between said emitter and said collector of said third transistor is conductive but that of said second transistor is non-conductive; and
an output terminal connected to said collector of said second transistor;
whereby a sharp trigger pulse is generated at said output terminal due to the release of said charge.
2. A trigger pulse generator circuit comprising:
a first and a second switching means connected in series through a circuit means, said first and said second switching means each having a control terminal;

an input terminal connected to each of said control terminals of said first and said second switching means, and receiving a rectangular pulse having a first and a second states;

an output terminal coupled with the junction point of said circuit means and said first switching means; and a resistor means connected in parallel to said first switching means;

said first switching means becoming conductive in response to said first state of said rectangular pulse and non-conductive in response to said second state of said rectangular pulse, said second switching means becoming conductive in response to said first state of said rectangular pulse and non-conductive in response to said second state of said rectangular pulse but after a predetermined time from the time when said first switching means becomes non-conductive, said second switching means including a charge-storage means for storing charge during the conductive state of said second switching means, said resistor means releasing said charge stored in said charge-stored means during said predetermined time when said second switching means is conductive but said first switching means is non-conductive;

whereby a sharp trigger pulse is generated at said output terminal due to the release of said charge.

3. The device of claim 2 wherein said first switching means comprises a first transistor of one conductivity type and adapted to be conductive in response to said rectangular pulse, said resistor means being connected between the emitter and collector of said first transistor; and wherein said second switching means comprises:
 a second transistor of the one conductivity type and adapted to be conductive in response to said rectangular pulse; and
 a third transistor of the opposite conductivity type and adapted to be conductive upon conduction of said second transistor;
 a resistor being connected between the collectors of said first and third transistors.

4. The device of claim 2 wherein said first switching means comprises a first transistor of one conductivity type and adapted to be conductive in response to said rectangular pulse, said resistor means being connected between the emitter and collector of said first transistor, and wherein said second switching means comprises:
 a second transistor of the one conductivity type and adapted to be conductive in response to said rectangular pulse;
 a third transistor of the opposite conductivity type and adapted to be conductive upon a conduction of said second transistor; and
 a fourth transistor of the opposite conductivity type and adapted to be conductive upon conduction of said third transistor, said third and fourth transistors being connected in a Darlington configuration;
 a resistor being connected between the collector of said first transistor and the emitter of said fourth transistor.

5. A trigger pulse generator circuit comprising, first and second transistors having their collector/emitter paths connected in series through a resistive element, means responsive to be input pulse assuming a first followed by a second state for saturating said first and said second transistors when said input pulse is in said first state, and for cutting off said first and subsequently said second transistor at a predetermined interval when said input pulse changes to said second state, and a load connected in parallel with the collector/emitter path of said first transistor and releasing a charge stored in said second transistor when said input pulse changes to said second state, whereby the current flowing through said second transistor after cut off of said first transistor also flows through said load to cause a voltage trigger pulse.

6. A trigger pulse generator as claimed in claim 5 wherein said means for saturating and for cutting off comprises:
 a. an input terminal adapted to receive said input pulse, and
 b. a third transistor, the base terminals of said first and third transistors being connected to said input terminal, the collector of said third transistor being connected to the base of said second transistor, and the emitter of said third transistor being connected in common with the emitter of said first transistor.

7. A trigger pulse generator circuit comprising:
 a first and a second switching means connected in series between a fixed potential terminal and a power source terminal, said first and said second switching means each having a control terminal;
 an input terminal connected to each of said control terminals of said first and said second switching means; and
 an output terminal coupled with the junction point of said first and said second switching means;
 said first switching means becomes conductive in response to the input pulse assuming a first state received at said input terminal and non-conductive in response to said input pulse assuming a second state, said second switching means becoming conductive in response to said input pulse assuming said first state and non-conductive in response to said input pulse assuming said second state but after a predetermined time from the time when said first switching means becomes non-conductive, said second switching means including a charge-storage means for storing charge during the conductive state of said second switching means, said circuit further comprising a discharge means connected to said output terminal for releasing said charge stored in said charge-storage means during said predetermined time when said second switching means is conductive but said first switching means is non-conductive;
 whereby a sharp trigger pulse is generated at said output terminal due to the release of said charge.

8. A trigger pulse generator circuit claimed in claim 7 wherein said second switching means comprises a delay means for causing said predetermined time.

9. A trigger pulse generator circuit claimed in claim 8 wherein said delay means is a transistor circuit having at least one transistor.

10. A trigger pulse generator circuit claimed in claim 7 wherein said first switching means comprises a first transistor having a base coupled with said input terminal, an emitter coupled with said fixed potential terminal, and a collector coupled with said junction point, the electrical state between said emitter and said collector becoming conductive in response to said input pulse assuming said first state, and said second switching means comprises a second transistor having a base coupled with said input terminal, an emitter and a collector, the electrical state between said emitter and said collector becoming conductive in response to said input pulse assuming said first state, and a third transistor becoming conductive in response to the conductive state of said second transistor with a delay to cause said second switching means to beocme conductive and becoming non-conductive in response to the non-conductive state of said second transistor with a delay to cause said second switching means to become non-conductive after said predetermined time from the time when said first switching means becomes non-conductive.

11. A trigger generator circuit claimed in claim 7 wherein said discharge means is a load.

12. A trigger pulse generator circuit claimed in claim 7 wherein said discharge means includes a resistor connected in parallel with said first switching means.

13. A trigger pulse generator circuit claimed in claim 7 wherein said second switching means becomes conductive in response to said input pulse assuming a first state at the same time or after said first switching means becomes conductive.

* * * * *

UNITED STATES PATENT AND TRADEMARK OFFICE
CERTIFICATE OF CORRECTION

PATENT NO. : 3,980,901
DATED : September 14, 1976
INVENTOR(S) : Kazuo TOKUDA

It is certified that error appears in the above-identified patent and that said Letters Patent are hereby corrected as shown below:

Column 2, line 61 - after "for" delete "in"

Column 3, line 5 - delete "saturations" and insert -- saturation -- line 45 - after "increasing" insert -- as -- line 46 - after "value" delete "in" and insert -- is --

Column 4, line 56 - delete "siad" and insert -- said --

Column 5, line 57 - after "upon" delete "a"

Column 6, line 1 - after "to" delete "be" and insert -- an -- line 34 - delete "becomes" and insert -- becoming --

Column 8, line 3 - after "trigger" insert -- pulse --

Signed and Sealed this

Thirtieth Day of November 1976

[SEAL]

Attest:

RUTH C. MASON
*Attesting Officer*

C. MARSHALL DANN
*Commissioner of Patents and Trademarks*